(12) United States Patent
Ghosh (10) Patent No.: US 6,844,215 B1
(45) Date of Patent: Jan. 18, 2005

(54) METHOD OF FORMING TAPERED DRAIN-TO-ANODE CONNECTORS IN A BACK PLANE FOR AN ACTIVE MATRIX OLED DEVICE

(75) Inventor: Amalkumar P. Ghosh, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/647,398

(22) Filed: Aug. 25, 2003

(51) Int. Cl.[7] .............................................. H01L 51/40
(52) U.S. Cl. .............................. 438/99; 438/29; 438/22; 438/40; 257/40
(58) Field of Search .............................. 438/22, 29, 99, 438/39, 40; 257/40

(56) References Cited

U.S. PATENT DOCUMENTS 6,461,885 B1 * 10/2002 Lupo et al. .................... 438/29
6,635,508 B2 * 10/2003 Arai et al. ..................... 438/99

\* cited by examiner

Primary Examiner—Michael S. Lebentritt
Assistant Examiner—Brad Smith
(74) Attorney, Agent, or Firm—Raymond L. Owens (57) ABSTRACT

A method is disclosed of forming tapered drain-to-anode connectors in a back plane of an active matrix OLED device. The method is also used in forming laterally spaced anode layers in contact with respectively corresponding drain-to-anode connectors.

9 Claims, 7 Drawing Sheets

METHOD OF FORMING TAPERED DRAIN-TO-ANODE CONNECTORS IN A BACK PLANE FOR AN ACTIVE MATRIX OLED DEVICE

FIELD OF THE INVENTION

The present invention relates to a method of forming tapered drain-to-anode connectors and tapered anode layers in a back plane for an active matrix OLED device.

BACKGROUND OF THE INVENTION

Organic light-emitting diode (OLED) devices, also referred to as organic electroluminescent (EL) devices, have numerous well known advantages over other flat-panel display devices currently in the market place. Among these advantages are brightness of light emission, relatively wide viewing angle, and reduced electrical power consumption compared to, for example, liquid crystal displays (LCDs).

Applications of OLED devices include active matrix image displays, passive matrix image displays, and area lighting devices such as, for example, selective desktop lighting. Irrespective of the particular OLED device configuration tailored to these broad fields of applications, all OLEDs function on the same general principles. An organic electroluminescent (EL) medium structure is sandwiched between two electrodes. At least one of the electrodes is light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the OLED is said to be forward biased. Positive charge carriers (holes) are injected from the anode into the EL medium structure, and negative charge carriers (electrons) are injected from the cathode. Recombination of holes and electrons within a zone of the EL medium structure results in emission of light from this zone that is, appropriately, called the light-emitting zone or interface. The emitted light is directed towards an observer, or towards an object to be illuminated, through the light transmissive electrode. If the light transmissive electrode is the lower or bottom electrode of the OLED device, the device is called a bottom-emitting OLED device. Conversely, if the light transmissive electrode is the upper or top electrode, the device is referred to as a top-emitting OLED device.

The organic EL medium structure can be formed of a stack of sublayers that can include small molecule layers and polymer layers. Such organic layers and sublayers are well known and understood by those skilled in the OLED art.

In an active matrix display device such as, for example, an active matrix OLED display or an active matrix liquid crystal display (LCD), the active matrix portion or component is first formed on a substrate. This active matrix portion is also referred to as a back plane of a device. Such back plane generally includes units of thin film elements which repeat in a two-dimensional pattern across a substrate surface.

Each repeating unit of thin film elements comprises a pixel of a display device, and can include thin film transistors dedicated to receive addressing signals (so-called switching transistors) and thin film transistors dedicated to actuate display elements which are disposed over the back plane (so-called current control transistors or drive transistors) and responsive to signals received from the switching transistors. The back plane can further include electrical wiring, X-direction driving circuits, Y-direction driving circuits, and a capacitor.

As is well known, each thin film transistor has a gate electrode, a source electrode, and a drain electrode. The drain electrode of each of the current control transistors or drive transistors needs to be accessible to provide an electrical connection between such drain electrode and a corresponding or associated display element which is to be formed over or above the back plane. Typically, the drain electrode of a drive transistor is electrically connected to an electrode layer of a display element such as, for example, a liquid crystal display element or an OLED display element to provide a display pixel.

Technology advances and manufacturing process improvements have resulted in ready availability of active matrix back planes which find applications in display devices of varied size, including relatively large flat-panel displays capable of providing full-color displays of video images. These advances and improvements have been largely driven by market forces in the arena of liquid crystal display panels.

Accordingly, particular designs of back plane electrical circuits and of drain-to-display electrode connectors have been optimized for such LCD applications and can include organic planarizing layers to planarize topological features of the back plane such as, for example, drain-to-display electrode connectors which can project upwardly from the back plane.

With particular reference to active matrix OLED display devices, organic planarizing layers have also been used to planarize topological features of the back plane prior to forming the display electrodes. However, it has been found that acrylic planarizing materials, used frequently to provide planarizing layers, have a propensity toward moisture penetration and moisture retention. Moisture, in the form of water molecules, can significantly reduce the operational lifetime of an OLED device. Accordingly, it is desirable to provide a back plane for an active matrix OLED device which does not require organic planarizing layers.

SUMMARY OF THE INVENTION

It is therefore an object of the present invention to provide a back plane for an active matrix OLED device by forming drain-to-anode connectors having tapered side walls.

It is another object of the present invention to provide a method of forming anode electrodes having tapered end walls in which each anode electrode is in electrical contact with a drain-to-anode connector and extends laterally beyond such connector.

In one aspect, one object is achieved by a method of forming drain-to-anode connectors in a back plane for an active matrix OLED device, comprising:

a) providing a substrate having at least one dielectric layer over a substrate surface;

b) providing a two-dimensional array of repeating units of thin film elements over the at least one dielectric layer, each of the repeating units including a current control transistor having a drain electrode;

c) providing a first organic layer over the two-dimensional array and a photoresist layer over the first organic layer;

d) exposing the photoresist layer to a pattern of activating radiation, the pattern corresponding to a location of the drain electrode of each of the current control transistors;

e) developing the exposed pattern in the photoresist layer and forming a corresponding pattern of undercut regions in the first organic layer;

f) forming drain-to-anode connectors by depositing conductive material in a line-of-sight pattern so that the conductive material contacts each drain electrode and extends laterally beyond each drain electrode to provide tapered side walls in the undercut regions;

g) removing the patterned first organic layer and the patterned photoresist layer; and h) forming an anode layer over each drain-to-anode connector and in electrical contact with such connector.

In another aspect, another object is achieved by a method of forming an anode layer over each drain-to-anode connector, comprising:

i) providing a first organic layer over the two-dimensional array including the drain-to-anode connectors and a photoresist layer over the first organic layer;

ii) exposing the photoresist layer to a pattern of activating radiation, the pattern corresponding to designated locations of an anode layer to be formed;

iii) developing the exposed pattern in the photoresist layer and forming a corresponding pattern of undercut regions in the first organic layer;

iv) forming laterally spaced anode layers by depositing anode-forming material in a line-of-sight pattern so that the anode-forming material contacts each drain-to-anode connector and extends laterally beyond each such connector to provide tapered end walls in the undercut regions; and v) removing the patterned first organic layer and the patterned photoresist layer.

ADVANTAGES

It is a feature of the present invention that the method of forming drain-to-anode connectors in a back plane for an active matrix OLED device simplifies the process of making the OLED device.

Another feature of the present invention is that the method of forming drain-to-anode connectors eliminates a need for organic planarizing layers in the process of making the OLED device.

Another feature of the present invention is that the methods of forming drain-to-anode connectors and of forming anode layers in electrical contact with such connectors eliminate a need for patterning the connectors and anode layers by etching processes.

BRIEF DESCRIPTION OF THE DRAWINGS

FIGS. 3A-3G depict schematically a sequence of process steps in forming drain-to-anode connectors and laterally spaced anode layers in accordance with the present invention, in which

The drawings are necessarily of a schematic nature since layer thickness dimensions are frequently in the sub-micrometer ranges, while features representing lateral device dimensions can be in a range from 10 micrometer to several 100 micrometer. Accordingly, the drawings are scaled for ease of visualization rather than for dimensional accuracy.

DETAILED DESCRIPTION OF THE INVENTION

As used herein, the term "light transmissive" refers to a substrate or to layers of a back plane, or to electrode layers of an OLED device, and denotes an optical transmission of between 50% and 95% of light directly perpendicularly at a surface of such substrate or layer. The term "reflective" refers to a reflective electrode layer of an OLED device and denotes an optical reflectance of at least 75% of light directed perpendicularly at such reflective layer. The terms "pixel" and "subpixel" are generally used to designate the smallest addressable element of a display. For monochrome OLED displays there is no distinction between a pixel and a subpixel. In multicolor displays, or in full-color displays, a subpixel designates any portion of a pixel which can be independently addressed to emit light of a specific color.

Figure 1:
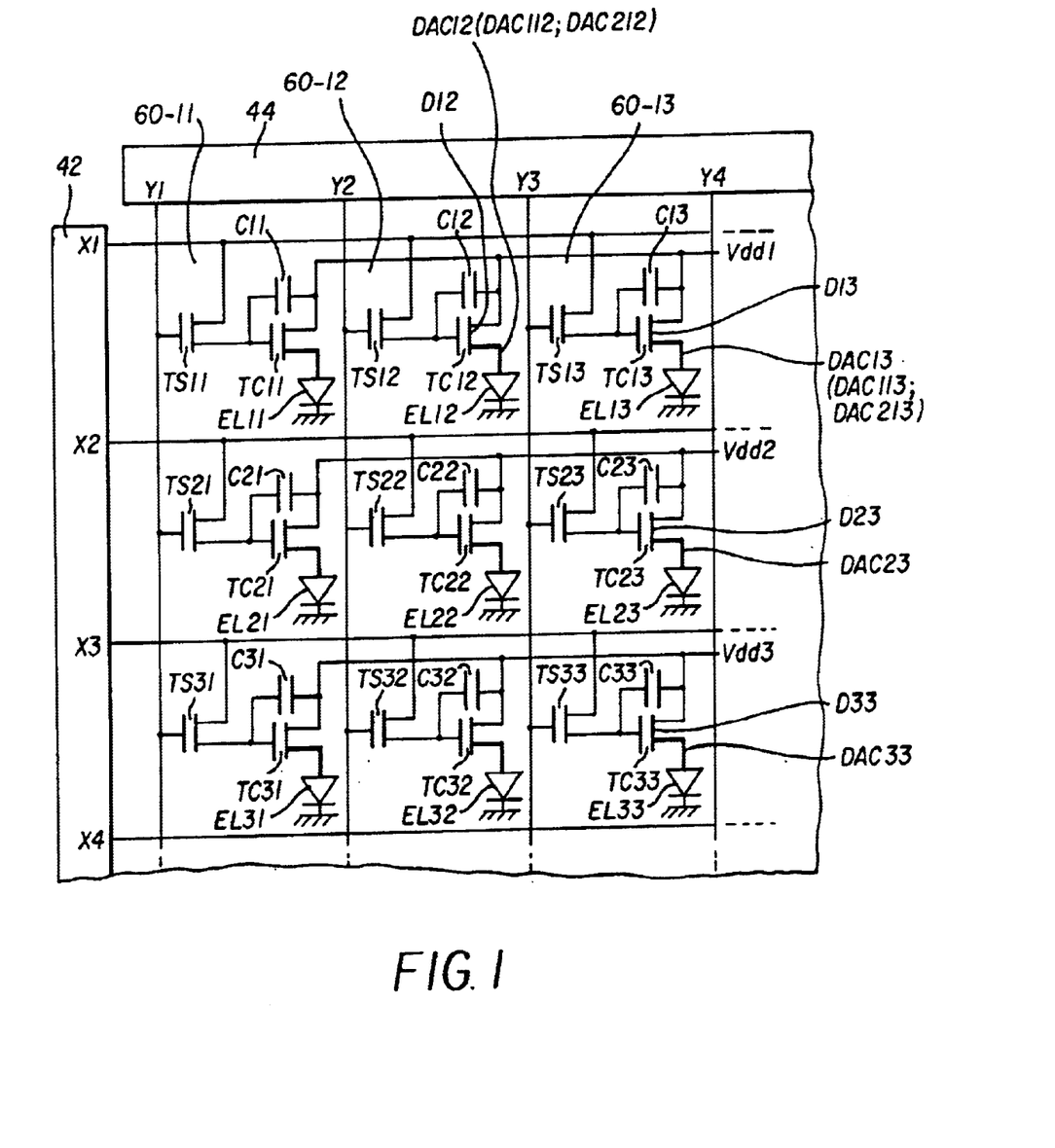
FIG. 1 depicts a partial view of a non-limiting example of a circuit diagram having a two-dimensional array of repeating units, and identifying some drain electrodes, drain-to-anode electrical connections, and associated organic electroluminescent (EL) medium structures which are shown in the form of diodes.

Turning now to FIG. 1, a partial view of a circuit diagram is depicted, having a two-dimensional array of repeating units. This array is referred to as an active matrix array, and is useful for independently addressing and for driving pixels or subpixels of an OLED device. In this circuit diagram, all of the following elements of each unit are considered to be included in the "back plane" of an active matrix OLED device in this non-limiting example:

X-direction signal lines X1, X2, X3, ..., Xn, Y-direction signal lines Y1, Y2, Y3, ..., Ym, power supply (Vdd) lines Vdd1, Vdd2, Vdd3, ..., Vddn, thin film transistors (TFTs) for switching TS11, TS21, TS31, ..., TSl2, TS22, TS23, ..., TS31, TS32, TS33, ..., TSnm, thin film transistors (TFTs) for current control TC11, TC21, TC31, ..., TC12, TC22, TC23, TC31, TC32, TC33, .... TCnm, capacitors C11, C21, C31, ..., C12, C22, C23, ..., C31, C32, C33, Cnm, X-direction driving circuit 42, and Y-direction driving circuit 44.

Also included in the back plane are drain-to-anode connectors which are designated as "DAC" in the drawing and shown in bold outline in each of the repeating units (particular ones of the repeating units are identified in FIG. 1 at 60-11, 60-12, and 60-13, corresponding respectively to pixels or subpixels in positions 1;1, 1;2, and 1;3). For example, the drain electrode D12 of transistor for current control TC12 is connected to an anode electrode or to an anode layer (not identified in the drawing) of the EL medium structure EL12 via a drain-to-anode connector DAC12. Similarly, drain electrode D13 of transistor TC13 is connected to an anode layer of EL13 via a drain-to-anode connector DAC13. Other drain-to-anode connectors are identified at DAC23 and DAC33 in FIG. 1. The drain-to-anode connectors DAC12 and DAC13 are shown in a prior art OLED device (see FIG. 2).

Also identified in FIG. 1 are drain electrodes D23 and D33 of respectively corresponding current control transistors TC23 and TC33.

Figure 3A:
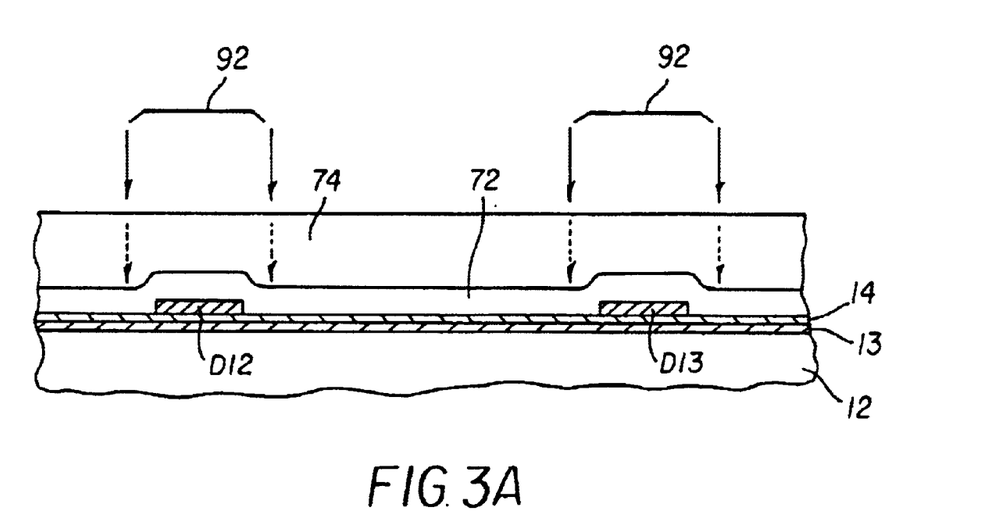
FIG. 3A shows drain electrodes in a back plane of a portion of an active matrix substrate, a first organic layer, and a photoresist layer being exposed to a pattern of activating radiation.
Figure 3B:
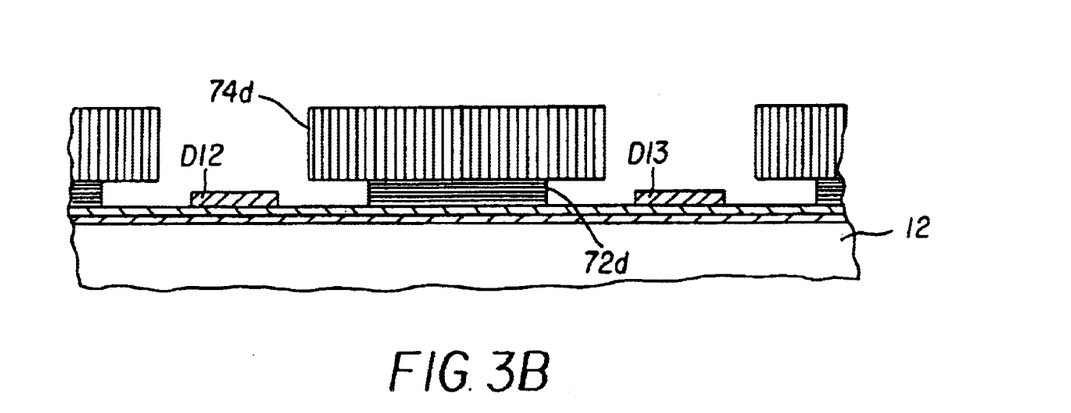
FIG. 3B depicts the patterned photoresist layer after development of the exposed pattern, and showing a pattern of the first organic layer being undercut with respect to side walls of the photoresist pattern.
Figure 3C:
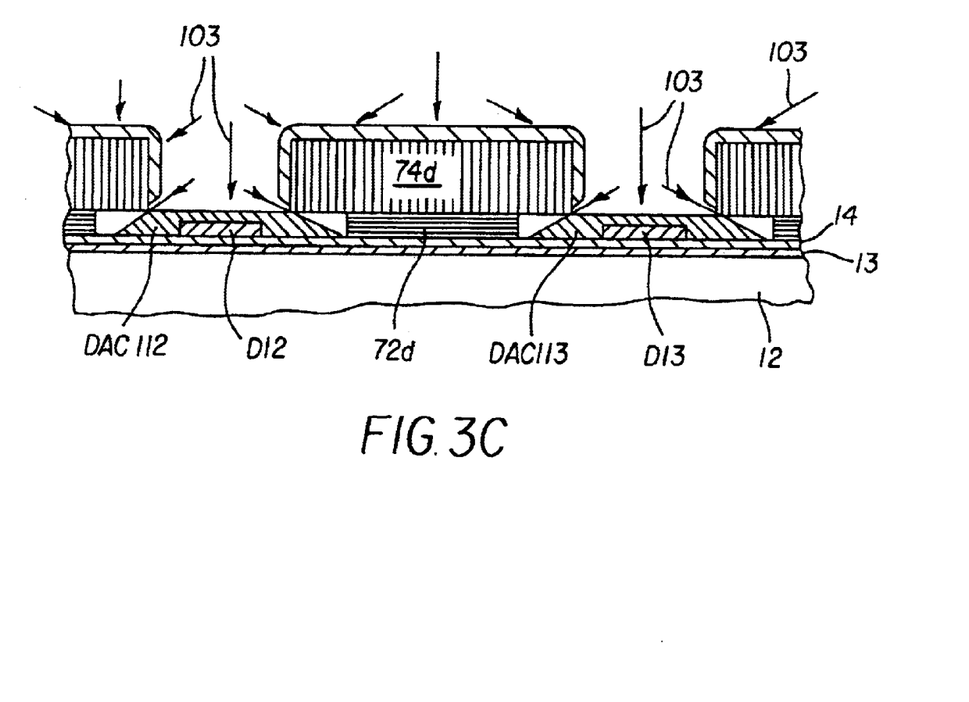
FIG. 3C shows schematically directions of depositing a conductive material over the drain electrodes to form a conductive drain-to-anode connector having tapered side walls.
Figure 3D:
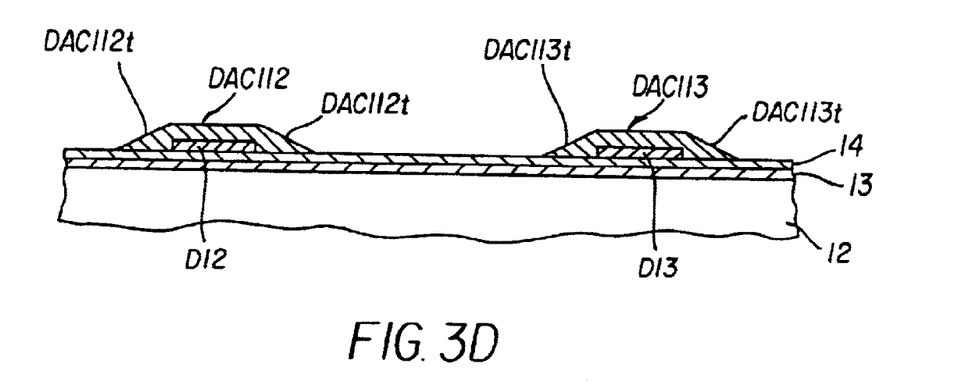
FIG. 3D shows the drain-to-anode connectors formed over the drain electrodes and the tapered side walls extending laterally beyond the drain electrodes, with the first organic layer pattern and the photoresist layer pattern removed by a lift-off process.
Figure 3E:
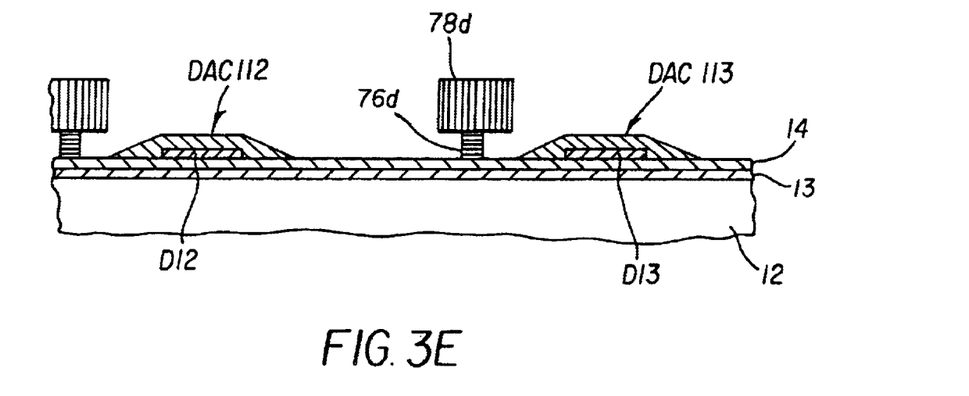
FIG. 3E indicates schematically a second photoresist pattern over an undercut first organic layer pattern.
Figure 3F:
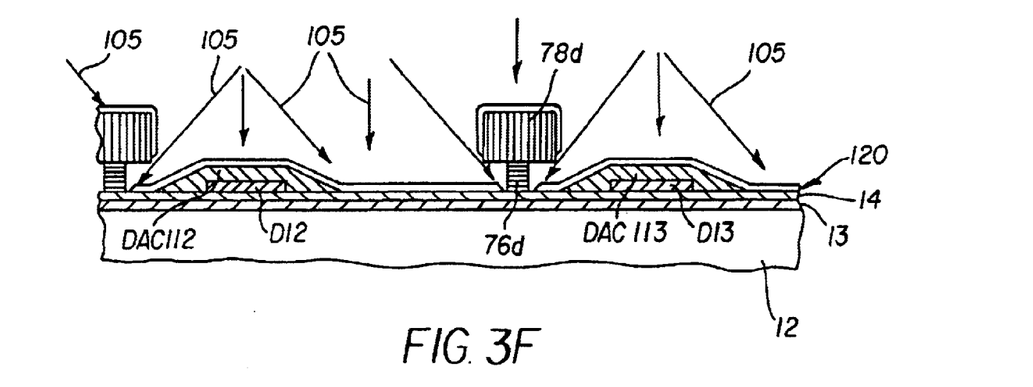
FIG. 3F shows schematically directions of depositing an anode material to form laterally spaced anode layers over the drain-to-anode connectors and having tapered end walls.
Figure 3G:
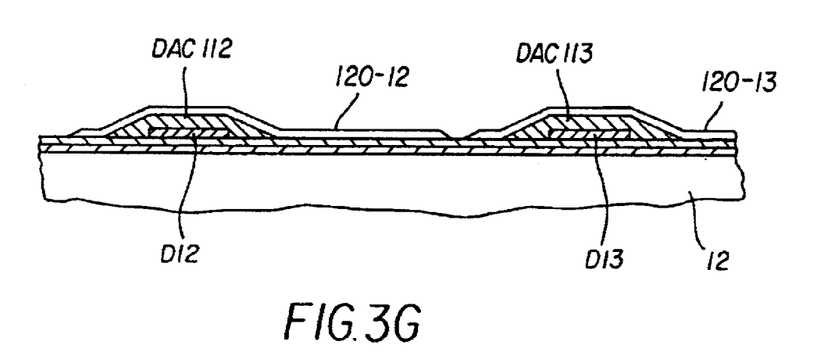
FIG. 3G shows the laterally spaced anodes, with the first organic layer pattern and the photoresist layer pattern removed by a lift-off process.
Figure 4:
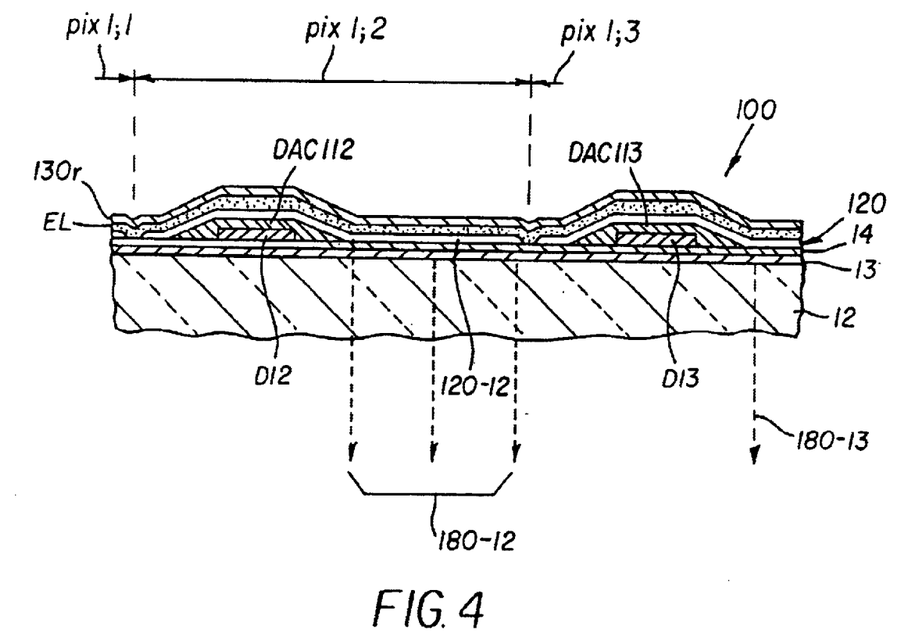
FIG. 4 depicts schematically a portion of a bottom-emitting active matrix OLED device having a reflective cathode layer, and incorporating the drain-to-anode connectors and the laterally spaced anode layers formed by the methods of the present invention.
Figure 5:
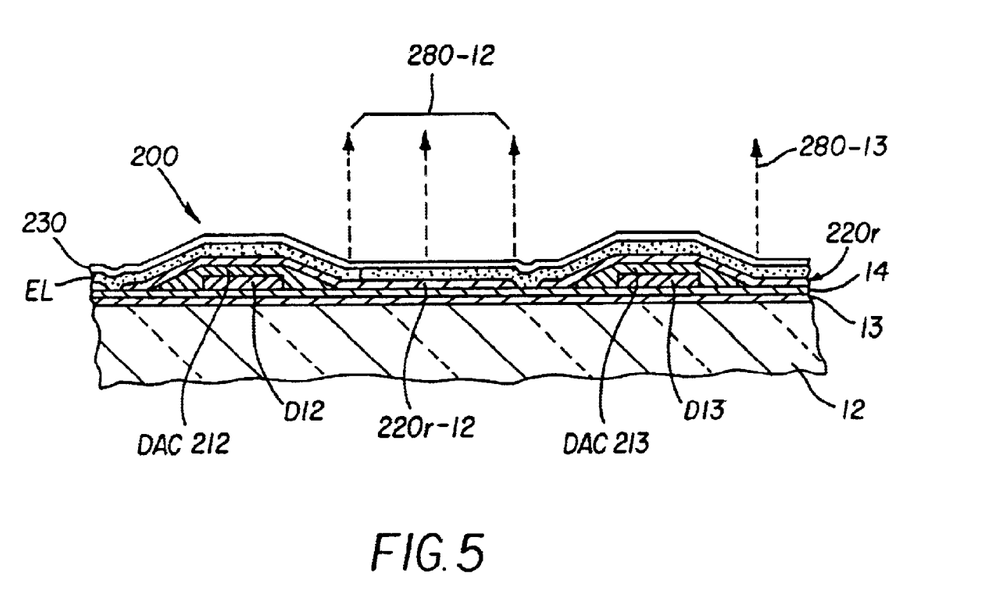
FIG. 5 shows schematically a portion of a top-emitting active matrix OLED device having a light transmissive cathode layer and laterally spaced reflective anode layers, and incorporating the drain-to-anode connectors and the laterally spaced anode layers formed by the methods of the present invention.

Drain-to-anode connectors made in accordance with the present invention are designated at DAC112, DAC113, and are shown in FIGS. 3C–3G and in FIG. 4. Drain-to-anode connectors DAC212 and DAC213 made in accordance with the present invention are shown in FIG. 5.

In order to more fully appreciate aspects of the present invention, a configuration of a prior art active matrix OLED device will be described with reference to FIG. 2.

Figure 2:
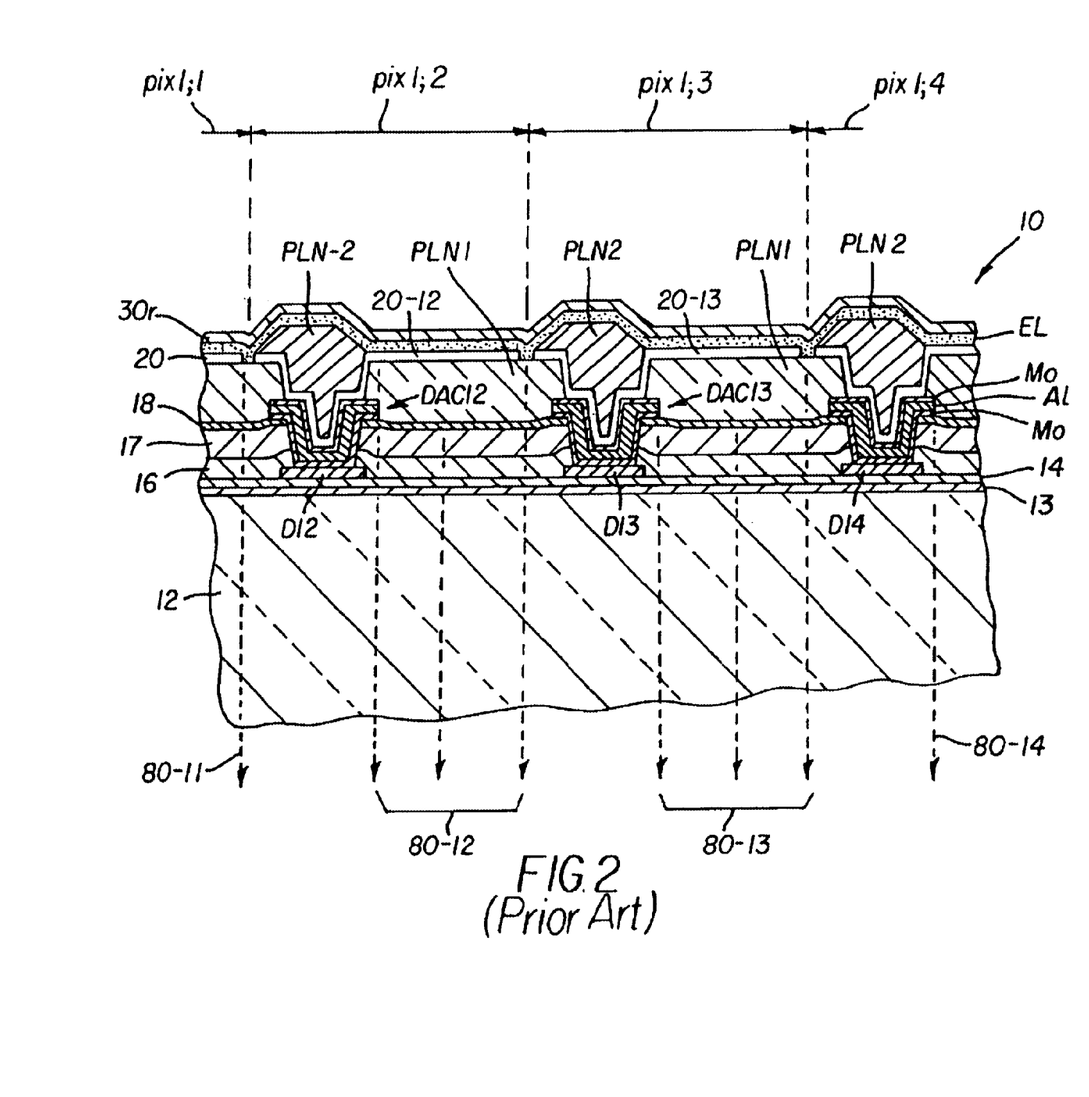
FIG. 2 is a schematic sectional view of a portion of a bottom-emitting active matrix OLED device showing prior art drain-to-anode connectors and prior art organic planarizing layers.

FIG. 2 is a schematic sectional view of a portion of a prior art bottom-emitting active matrix OLED device 10. On a surface of a glass substrate 12 is deposited a first silicon nitride (SiN) layer 13, and a first silicon dioxide (SiO$_2$) layer 14 is formed over the SiN layer. Laterally spaced drain electrodes D12, D13, and D14 of respective thin film transistors for current control TC12, TC13, and TC14 (not shown in FIG. 1) are formed over the first SiO$_2$ layer 14.

In order to preserve visual clarity of the drawings, only the drain electrodes of the current control transistors are depicted in FIG. 2, and in FIGS. 3A–3G, FIG. 4, and FIG. 5. Such drain electrodes are to be electrically connected to corresponding anode layers of an OLED device via drain-to-anode connectors.

The fabrication of the prior art OLED device 10 proceeds with deposition, in sequence, of a second SiO$_2$ layer 16 over the drain electrodes D12, D13, D14, and over the first SiO$_2$ layer 14, a second SiN layer 17, and a third SiO$_2$ layer 18.

Openings, also referred to as vias (not identified in FIG. 2) are etched through the layers 18, 17, and 16 to reveal a central portion of each drain electrode. Electrically conductive drain-to-anode connectors such as, for example, the connectors DAC12 and DAC13 are then formed by a high energy deposition process (sputter deposition or electron beam deposition), by firstly forming a "connector layer" across the entire upper surface (not identified) of the third SiO$_2$ layer 18, and by secondly delineating the lateral dimensions of the drain-to-anode connectors via wet or dry etching processes.

The drain-to-anode connectors DAC12, DAC13, etc. are depicted here as a three-layer sandwich which includes a molybdenum (Mo) layer in contact with a drain electrode, an aluminum (Al) interlayer, and a molybdenum top layer.

A light transmissive first organic planarizing layer PLN1 is formed over the third SiO$_2$ layer 18 and over the recessed portions (not identified) of the drain-to-anode connectors. PLN1 is then patterned so that the organic layer PLN1 is removed from the recessed portions and from portions which laterally extend therefrom.

A light transmissive anode layer 20 is deposited firstly as a continuous layer over the first organic planarizing layer PLN1 and into the recess portions so that the anode layer 20 is in electrical contact with portions of the drain-to-anode connectors DAC12, DAC13, etc. Anode segments 20-12 and 20-13 are then provided by etching channels through the anode layer 20 so that pixels or subpixels pix 1;1, pix 1;2, pix 1;3, and pix 1;4 are defined by respectively corresponding drain electrodes, drain-to-anode connectors, and light transmissive anode segments.

An organic electroluminescent (EL) medium structure is formed over the anode segments by sequential deposition of several sublayers as is well known to those skilled in the art of making OLEDs. For example, the organic EL medium structure can include a hole injection layer in contact with the anode layer segments and, in sequence, a hole transport layer, an emissive layer, an electron transport layer, and an optional electron injection layer. A reflective common cathode layer 30r is provided over the electron transport layer or over the electron injection layer, if used.

Well known conventional methods can be employed for selectively depositing emissive sublayers over designated anode layer segments to provide subpixels of a multicolor active matrix OLED display.

Viewing FIG. 1 and FIG. 2 together, sequentially, one pixel or subpixel at a time is selected by one of the X-direction signal lines X1 to Xn and one of the Y-direction signal lines Y1 to Ym, and a thin film transistor for switching TS comes into the "on" state at this selected pixel or subpixel and, accordingly, an associated thin film transistor for current control TC comes into the "on" state. Thus, an electric current supplied from a power supply line Vdd flows in the EL medium structure which is sandwiched between the anode segments 20-12 and 20-13 and the reflective common cathode layer 30r. Sequentially, emitted light 80-11 is generated within the EL medium structure of a pixel or subpixel pix 1;1, followed by light emission over a central portion of pix 1;2 identified at 80-12, etc.

The active matrix OLED device 10 is called a bottom-emitting device since emitted light is directed towards an observer through the glass substrate 12 which is generally considered to be the "bottom" of the device. It should be understood that the inorganic (SiN, SiO$_2$) layers 13, 14, 16, 17, and 18 are substantially light transmissive, as is the first organic planarizing layer PLN1. Light emitted within the organic EL medium structure in an upwardly direction will be reflected downwardly by the reflective common cathode layer 30r.

From the foregoing description, it will be apparent that the construction of an example of a prior art active matrix OLED device, such as the device of FIG. 2, requires numerous and relatively complex processing steps, firstly in the fabrication of the back plane and secondly in the fabrication of required planarizing layers PLN1 and PLN2.

The inventive method of making an active matrix OLED device will now be described with reference to FIGS. 3A–3G and FIG. 4. In these drawings, the glass substrate 12, the first SiN layer 13, the first SiO$_2$ layer 14, and the drain electrodes D12 and D13 are identified with the same numeral designations described with reference to like elements in FIG. 2.

In FIG. 3A an organic anti-reflection layer 72 is first coated over the SiO$_2$ layer 14 and over the drain electrodes D12 and D13, for example by spin-coating from a solution of an anti-reflection coating (ARC) material that is commercially available from Brewer Science Corporation of Rolla, Mo., U.S.A. The anti-reflection layer 72 is then baked at a temperature and for a duration selected to provide a selected lateral dissolution rate in a liquid developer.

A positive-working photoresist layer 74 is formed over the baked anti-reflection layer 72, for example by spin-coating from a photoresist solution that is commercially available. The photoresist layer 74 is also baked at a selected temperature and for a selected duration.

A first-pattern radiation exposure 92 of activating radiation is directed at the photoresist layer 74. This first-pattern exposure extends symmetrically with respect to the drain electrodes D12 and D13 by a selected distance (not identified in the drawings).

FIG. 3B depicts the patterned photoresist layer 74d after development of the exposed first pattern in a typical liquid developer such as tetramethyl ammonium hydroxide (TMAH).

As the liquid developer has completed removal of the previously exposed pattern in the photoresist layer, the developer dissolves in lateral directions portions of the anti-reflection layer 72 to provide an undercut first pattern of developed anti-reflection layer 72d. The drain electrodes D12 and D13 are now revealed and are centered with respect to the patterned photoresist layer 74d and with respect to the patterned anti-reflection layer 72d.

FIG. 3C shows schematically the process of forming electrically conductive drain-to-anode connectors DAC112 and DAC113 over respective drain electrodes D12 and D13.

A vapor deposition process is used to form metallic drain-to-anode connectors. Particularly useful vapor deposition processes include sputter deposition and electron beam deposition. Such processes provide a relatively wide angular distribution of vapors that can be molecular or atomic vapors. The directions of incidence of such vapors are indicated by arrows at 103. It will be appreciated that the deposition process is carried out within a chamber (not shown) held at reduced pressure.

The drain-to-anode connectors DAC112 and DAC113 are formed by a line-of-sight deposition in which lower edges (not identified) of the photoresist pattern 74d cast a shadow with respect to the directions 103 of the vapors with the undercut regions defined by the pattern 72d of the anti-reflection layer. Thus, the drain-to-anode connectors formed over the drain electrodes D12 and D13 extend laterally beyond these electrodes and have tapered portions DAC112t and DAC113t, respectively, which are identified in FIG. 3D. These tapered portions are also called tapered side walls.

Drain-to-anode connector deposits also form over upper surfaces and side surfaces (not identified in the drawings) of the patterned photoresist layer 74d.

The inventive drain-to-anode connectors can be formed of a metal such as, for example, molybdenum, silver, platinum, or aluminum. Alternatively, the drain-to-anode connectors can be formed of a metal alloy or of a metal containing a dopant such as, for example, aluminum doped with silicon.

The drain-to-anode connectors can also be formed in a bilayer configuration or in a trilayer configuration such as depicted in the prior art device of FIG. 2. Such bilayer or trilayer drain-to-anode connectors can include at least one metal layer and at least one metal alloy layer which are deposited sequentially.

FIG. 3D shows the drain-to-anode connectors DAC112 and DAC113 having the tapered portions or tapered side walls DAC112t and DAC113t, respectively. The patterned photoresist layer 74d and the patterned anti-reflection layer 72d have been removed by a so-called lift-off process which is generally well known to those skilled in the art of photolithography processes. Typically, a solvent or a solvent mixture is used to dissolve the pattern of the anti-reflection layer 72d, thus resulting in lift-off and removal of the patterned photoresist layer 74d.

FIG. 3E indicates schematically a second photoresist layer pattern 78d over an undercut anti-reflection layer pattern 76d.

FIG. 3F shows schematically a vapor deposition process for depositing laterally spaced anode layers 120 over the drain-to-anode connectors DAC112 and DAC113, respectively. As described with reference to FIG. 3C, particularly useful deposition processes include sputter deposition or electron beam deposition that provide a relatively large angular distribution of vapors. The directions of incidence of vapors of anode-forming material are indicated by arrows at 105. It will be understood that this deposition process is also carried out within a chamber held at reduced pressure.

The anode layers are formed by a line-of-sight deposition in which lower edges (not identified) of the photoresist pattern 78d cast a shadow with respect to the directions 105 of the vapors within the undercut regions defined by the pattern 76d of the anti-reflection layer. Thus, the anode layers 120 formed over the drain-to-anode connectors DAC112 and DAC113 extend laterally beyond these connectors and have tapered side walls (not identified in the drawings). Deposits of anode-forming material are also formed over upper surfaces and side surfaces (not identified in the drawings) of the photoresist layer pattern 78d.

The anode layer 120 can be formed of a light transmissive material which is electrically conductive, and having a work function higher than 4.0 eV. Suitable materials for forming anodes include, but are not limited to, tin oxide, indium tin oxide, and light transmissive thin films of metals such as, for example silver, nickel, or gold.

FIG. 3G shows the laterally spaced anodes as light transmissive anode segments 120-12 and 120-13. Anode segment 120-12 is in electrical contact with the drain-to-anode connector DAC112 which, in turn, is in electrical contact with the drain electrode D12 of the transistor for current control TC12 (see FIG. 1). Similarly, anode segment 120-13 is in electrical contact with the drain-to-anode connector DAC113 that is formed over the drain electrode D13.

The photoresist layer pattern 78d and the undercut anti-reflection layer pattern 76d have been removed by the lift-off process described previously with reference to FIG. 3D.

FIG. 4 depicts schematically a portion of a bottom-emitting active matrix OLED device 100 having a reflective common cathode layer 130r, and incorporating the drain-to-anode connectors DAC112 and DAC113, and identifying one light transmissive anode segment 120-12 which defines a pixel or subpixel pix 1;2. The EL medium structure has been described previously with reference to FIG. 2. An operative device 100 sequentially produces emitted light 180-12 and 180-13 in corresponding pixels or subpixels pix 1;2 and pix 1;3.

FIG. 5 shows schematically a portion of a top-emitting active matrix OLED device 200 having a light transmissive common cathode layer 230 and a reflective anode layer 220r. A reflective anode segment 220r-12 is in electrical contact with the drain-to-anode connector DAC 212 which, in turn, is in electrical contact with the drain electrode D12.

A drain-to-anode connector DAC213 is also shown. The EL medium structure has been described with reference to FIG. 2. The operative device 200 sequentially produces emitted light 280-12 and 280-13 in corresponding pixels or subpixels (not further identified in FIG. 5).

From the foregoing description it will be apparent that the inventive method of forming drain-to-anode connectors in a back plane of an a active matrix array is significantly simpler than the prior art method described with reference to FIG. 2. Fewer inorganic layers are required, and etching of openings or vias is eliminated. Organic planarizing layers are not needed.

Additionally, the inventive method can be used in forming laterally spaced anode layers or anode segments without an etching process.

The invention has been described in detail with particular reference to certain preferred embodiments thereof, but it will be understood that variations and modifications can be effected within the spirit and scope of the invention.

Parts List 10 bottom-emitting active matrix OLED device (prior art)
12 glass substrate
13 first silicon nitride (SiN) layer
14 first silicon dioxide ($SiO_2$) layer
16 second $SiO_2$ layer
17 second SiN layer
18 third $SiO_2$ layer
20 light transmissive anode layer
20-12 light transmissive anode segment (in pixel 1;2)
20-13 light transmissive anode segment (in pixel 1;3)
30r reflective common cathode layer
42 X-direction driving circuit
44 Y-direction driving circuit
60-11 transistors, capacitor, and electrical wiring (in pixel 1;1)
60-12 transistors, capacitor, and electrical wiring (in pixel 1;2)
60-13 transistors, capacitor, and electrical wiring (in pixel 1;3)
72 organic anti-reflection layer
72d developed anti-reflection layer (first pattern)
74 positive-working photoresist layer
74d developed photoresist layer (first pattern)
76d developed anti-reflection layer (second pattern)
78d developed photoresist layer (second pattern)
80-11 emitted light (from pixel 1:1)
80-12 emitted light (from pixel 1;2)
80-13 emitted light (from pixel 1;3)
80-14 emitted light (from pixel 1;4)

Parts List (Con't)

92 first pattern radiation exposure of photoresist layer (74)
100 bottom-emitting active matrix OLED device (inventive)
103 directions of vapors in forming metallic drain-to-anode connectors (DACs)
105 directions of vapors in forming anode segments
120 light transmissive anode layer
120-12 light transmissive anode segment (in pixel 1;2)
120-13 light transmissive anode segment (in pixel 1;3)
130r reflective common cathode layer
180-12 emitted light (from pixel 1;2)
180-13 emitted light (from pixel 1;3)
200 top-emitting active matrix OLED device (inventive)
220r reflective anode layer
220r-12 reflective anode segment (in pixel 1;2)
230 light transmissive common cathode layer
280-12 emitted light (from pixel 1;2)
280-13 emitted light (from pixel 1;3)
D12 drain electrode of a current control transistor (in pixel 1;2)
D13 drain electrode of a current control transistor (in pixel 1;3)
D14 drain electrode of a current control transistor (in pixel 1;4)
D23 drain electrode of a current control transistor (in pixel 2;3)
D33 drain electrode of a current control transistor (in pixel 3;3)
DAC12 drain-to-anode connector (prior art; in a pixel 1;2)
DAC13 drain-to-anode connector (prior art; in a pixel 1;3)
DAC23 drain-to-anode connector (prior art; in a pixel 2;3)
DAC33 drain-to-anode connector (prior art; in a pixel 3;3)
DAC112 drain-to-anode connector (inventive; in a pixel 1;2)
DAC113 drain-to-anode connector (inventive; in a pixel 1;3)

Parts List (Con't)

DAC112t tapered portion(s) of drain-to-anode connector (DAC112)
DAC113t tapered portion(s) of drain-to-anode connector (DAC113)
DAC212 drain-to-anode connector (inventive; in a pixel 1;2)
DAC213 drain-to-anode connector (inventive; in a pixel 1;3)
pix 1;1 pixel or subpixel 1;1
pix 1;2 pixel or subpixel 1;2
pix 1;3 pixel or subpixel 1;3
pix 1;4 pixel or subpixel 1;4
PLN1 light transmissive first organic planarizing layer (prior art)
PLN21 light transmissive second organic planarizing layer (prior art)
Cnm capacitor (in a pixel n;m)
EL organic electroluminescent ("EL") medium structure
ELnm organic EL medium structure (in a pixel n;m)
TCnm thin film transistor for current control (in a pixel n;m)
TSnm thin film transistor for switching (in a pixel n;m)
Vddn power supply lines where n is an integer
Xn X-direction signal lines where n is an integer
Ym Y-direction signal lines where m is an integer

What is claimed is:

1. A method of forming drain-to-anode connectors in a back plane for an active matrix OLED device, comprising:
   a) providing a substrate having at least one dielectric layer over a substrate surface;
   b) providing a two-dimensional array of repeating units of thin film elements over the at least one dielectric layer, each of the repeating units including a current control transistor having a drain electrode;
   c) providing a first organic layer over the two-dimensional array and a photoresist layer over the first organic layer;
   d) exposing the photoresist layer to a pattern of activating radiation, the pattern corresponding to a location of the drain electrode of each of the current control transistors;
   e) developing the exposed pattern in the photoresist layer and forming a corresponding pattern of undercut regions in the first organic layer;
   f) forming drain-to-anode connectors by depositing conductive material in a line-of-sight pattern so that the conductive material contacts each drain electrode and extends laterally beyond each drain electrode to provide tapered side walls in the undercut regions;
   g) removing the patterned first organic layer and the patterned photoresist layer; and h) forming an anode layer over each drain-to-anode connector and in electrical contact with such connector.

2. The method of claim 1 wherein step h) includes:

i) providing a first organic layer over the two-dimensional array including the drain-to-anode connectors and a photoresist layer over the first organic layer;

ii) exposing the photoresist layer to a pattern of activating radiation, the pattern corresponding to designated locations of an anode layer to be formed;

iii) developing the exposed pattern in the photoresist layer and forming a corresponding pattern of undercut regions in the first organic layer;

iv) forming laterally spaced anode layers by depositing anode-forming material in a line-of-sight pattern so that the anode-forming material contacts each drain-to-anode connector and extends laterally beyond each such connector to provide tapered end walls in the undercut regions; and v) removing the patterned first organic layer and the patterned photoresist layer.

3. The method of claim 2 further including forming the OLED device over the laterally spaced anode layers.

4. The method of claim 3 wherein the step of forming the OLED device includes forming an organic electroluminescent (EL) medium structure over each laterally spaced anode layer and forming a common cathode layer over the organic EL medium structure.

5. The method of claim 1 wherein step c) further includes baking the first organic layer prior to providing the photoresist layer over the first organic layer, and baking the photoresist layer.

6. The method of claim 5 further including providing an organic anti-reflection material as the first organic layer, and providing a positive-working photoresist material as the photoresist layer.

7. The method of claim 1 wherein step g) further includes removing the patterned first organic layer and the patterned photoresist layer by treating such layers with a solvent or with a solvent mixture.

8. The method of claim 1 wherein the step f) includes depositing metal in a chamber at reduced pressure by a sputter deposition process or by an beam deposition process.

9. The method of claim 8 further including depositing a metal, a metal alloy, of a stack of layers comprised of more than one metal layer, more than one metal alloy layer, or a combination of at least one metal layer and at least one metal alloy layer.

* * * * *